United States Patent [19]

Harvey et al.

[11] Patent Number: 4,835,078
[45] Date of Patent: May 30, 1989

[54] METHOD FOR ALIGNING PHOTOMASKS

[75] Inventor: George T. Harvey; Laurence S. Watkins, both of Princeton, N.J.

[73] Assignee: American Telephone and Telegraph Company, N.Y.

[21] Appl. No.: 69,901

[22] Filed: Jul. 6, 1987

[51] Int. Cl.$^4$ ............................................. G03F 9/00
[52] U.S. Cl. ..................................... 430/22; 430/311; 430/394; 250/548; 356/400
[58] Field of Search ................... 430/22, 394, 396, 4, 430/320, 311, 327, 319; 356/400, 401, 399; 250/548

[56] References Cited

U.S. PATENT DOCUMENTS

| | | | |
|---|---|---|---|
| 3,264,105 | 8/1966 | Houtz | 430/319 X |
| 3,759,767 | 9/1973 | Walls | 156/17 |
| 3,963,489 | 6/1976 | Cho | 430/22 |
| 4,109,158 | 8/1978 | Blitchington et al. | 250/548 |
| 4,311,389 | 1/1982 | Fay et al. | 356/354 |
| 4,545,683 | 10/1985 | Markle et al. | 356/400 |

Primary Examiner—José G. Dees
Attorney, Agent, or Firm—Roderick B. Anderson

[57] ABSTRACT

Photomasks (11,12) are aligned on opposite sides of a wafer by directing light beams through zone plates (13 A–C) in one photomask and through aligned transparent slits (14 A–C) on the other photomask. Simultaneous detection of the beams by photodetectors (18 A–C) indicates alignment. A method for obtaining precise centering by scanning the slits with the beams, sampling light transmitted through the slits, and fitting the samples to a parabola by the use of a computer (27) is also described.

6 Claims, 4 Drawing Sheets 4,835,078

METHOD FOR ALIGNING PHOTOMASKS

TECHNICAL FIELD

This invention relates to mask aligning methods, and, more particularly, to methods for aligning photolithographic masks (photomasks) on opposite sides of a flat workpiece.

BACKGROUND OF THE INVENTION

Photolithographic masking and etching is widely understood because of its extensive use in the fabrication of integrated circuits. In such processes, a semiconductor wafer is coated with a thin layer of photoresist material and is exposed to actinic light through a patterned photomask. After development, the photoresist coating itself acts as a mask to permit selective processing, such as selective etching, of the wafer.

It has been found that the same process is useful for making optic fiber connectors from silicon wafers. Each connector comprises a silicon chip having grooves on opposite sides which are used to contain optic fibers and to align the connector. Since the alignment of optic fibers for lightwave transmission is extremely critical, it is important that the support grooves be accurately located to within tolerances that are typically less than one micron. For this reason, in the fabrication of such connectors, it is critical to align accurately photomasks on opposite sides of a semiconductor wafer that has been coated with photoresist material.

The U.S. Pat. No. of K. H. Chou, 3,963,489, issued June 15, 1976, is in example of prior art teachings of methods for aligning photomasks on opposite sides of a semiconductor wafer. The Chou technique uses indexing indicia on corresponding portions of the two photomasks that overlap the wafer contained between them. By properly aligning these indicia, one aligns the mask patterns of the two masks with respect to the intervening semiconductor wafer.

A problem with using a scheme such as this for aligning masks with submicron tolerances is that a sufficiently high-power microscope for making the alignment will normally have a smaller depth of field than the separation of the two masks. Thus, the operator cannot see both alignment indicia simultaneously during the alignment operation. One way of meeting this problem would be to align the two masks while they are in close contact and then separate them to incorporate the wafer. In practice, it has been found to be extremely difficult, if not impossible, to make the required mechanical separation while maintaining the required close tolerances.

SUMMARY OF THE INVENTION

In accordance with the invention, these problems are solved by making a plurality of zone plates on the periphery of one of the masks and a plurality of transparent slits on the periphery of the other mask, each slit being aligned with a corresponding zone plate. The masks are then conveniently aligned on opposite sides of a wafer by directing collimated light through one of the zone plates and then moving the masks relative to each other until the light beam focused by the zone plate is transmitted through a corresponding transparent slit. Three zone plates with corresponding transparent slits may be used for aligning the mask in X,Y and angular (or $\theta$) directions.

Transmission of the light beam through a transparent slit is conveniently detected automatically by a light detector. As will be explained in more detail below, a high degree of alignment accuracy can be obtained by scanning the light beam across the transparent slit, making three light intensity measurements during the scan and using a computer to fit the three intensity points to a parabolic curve. The computer can then determine the maximum of the parabolic curve, which will then correspond to the center of the transparent slit and move the mask relative to the light beam to get precise centering of the light beam on the slit.

These and other objects and features of the invention will be better understood from a consideration of the following detailed description taken in conjunction with the accompanying drawing.

DETAILED DESCRIPTION

Figure 1:
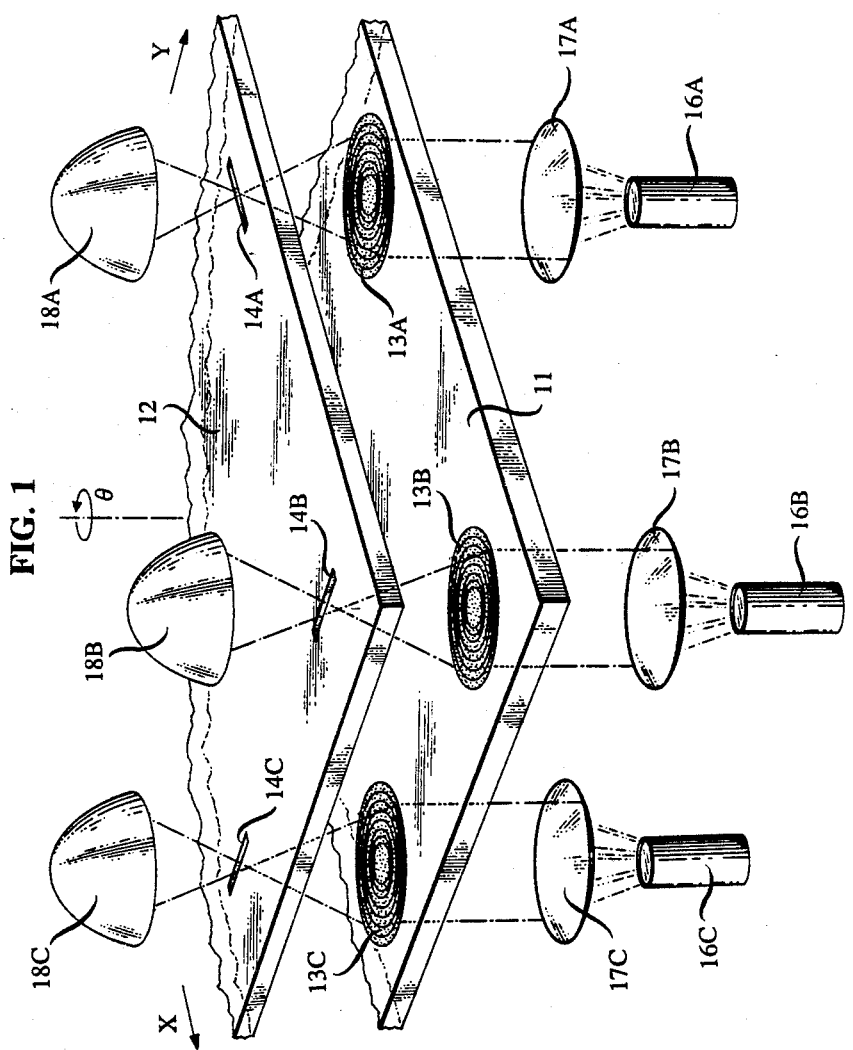
FIG. 1 is a schematic illustration of apparatus for aligning photomasks in accordance with one embodiment of the invention.

Referring now to FIG. 1, there are shown schematically first and second photomasks 11 and 12 for illustrating the general principles of the invention. For purposes of expediency, neither the pattern of the photomasks nor the wafer between them which is to be exposed has been shown. The only devices shown are those for aiding in mask alignment.

Arranged around a periphery of the lower photomask 11 are three zone plates 13A, 13B, and 13C. Aligned respectively with the zone plates on the upper photomask 12 are three transparent slits 14A, 14B, and 14C. As is known, zone plates are diffraction elements, which, when arranged in the shape of concentric circles, may act as circular lenses. Both the zone plates 13A–C and the transparent slits 14A–C may conveniently be made at the same time that the photolithographic mask patterns in the photomasks are made.

Light from light sources 16A–C, which may be optic fibers, is collimated by collimating lenses 17A–C and is directed through the zone plates 13A–C. The zone plates focus the light into beams which, when the masks are properly aligned, are transmitted through the corresponding transparent slits 14A-C.

In accordance with the invention, the masks are aligned by moving the upper photomask 12 in X,Y and $\theta$ directions relative to the lower mask 11 until the three focused beams are transmitted through the three slits 14A-C. Preferably, the upper photomask 12 is moved in a Y direction until focused light from zone plate 13A is transmitted through transparent slit 14A and detected by photodetector 18A. After initial detection, the photomask 12 may be slowly scanned in the Y direction to determine the position at which light transmitted through opening 14A is at a maximum. The position of maximum light power transmission of course indicates a precise centering of the transparent slit with respect to the light beam. The slits 14A–C have a long dimension transverse to the direction of scan during alignment. For example, slit 14A, used for Y direction alignment, has a long dimension in the X direction. Slits 14C and 14B are arranged along a line parallel to the Y axis.

After Y direction alignment, the upper photomask is scanned in the X direction until light is initially detected by detectors 18B and 18C. An angular adjustment is made so that light is detected simultaneously by both detectors, 18B and 18C during a scan. Such adjustments may be made after repetitive slow X-direction scans to obtain maximum light power detection simultaneously by the detectors 18B and 18C, which indicates both X-direction and $\theta$ alignment. After alignment in all three directions, as indicated by maximum power output of all thru detectors 18A–C, masks 11 and 12 are fixed for exposure of the wafer.

Figure 2:
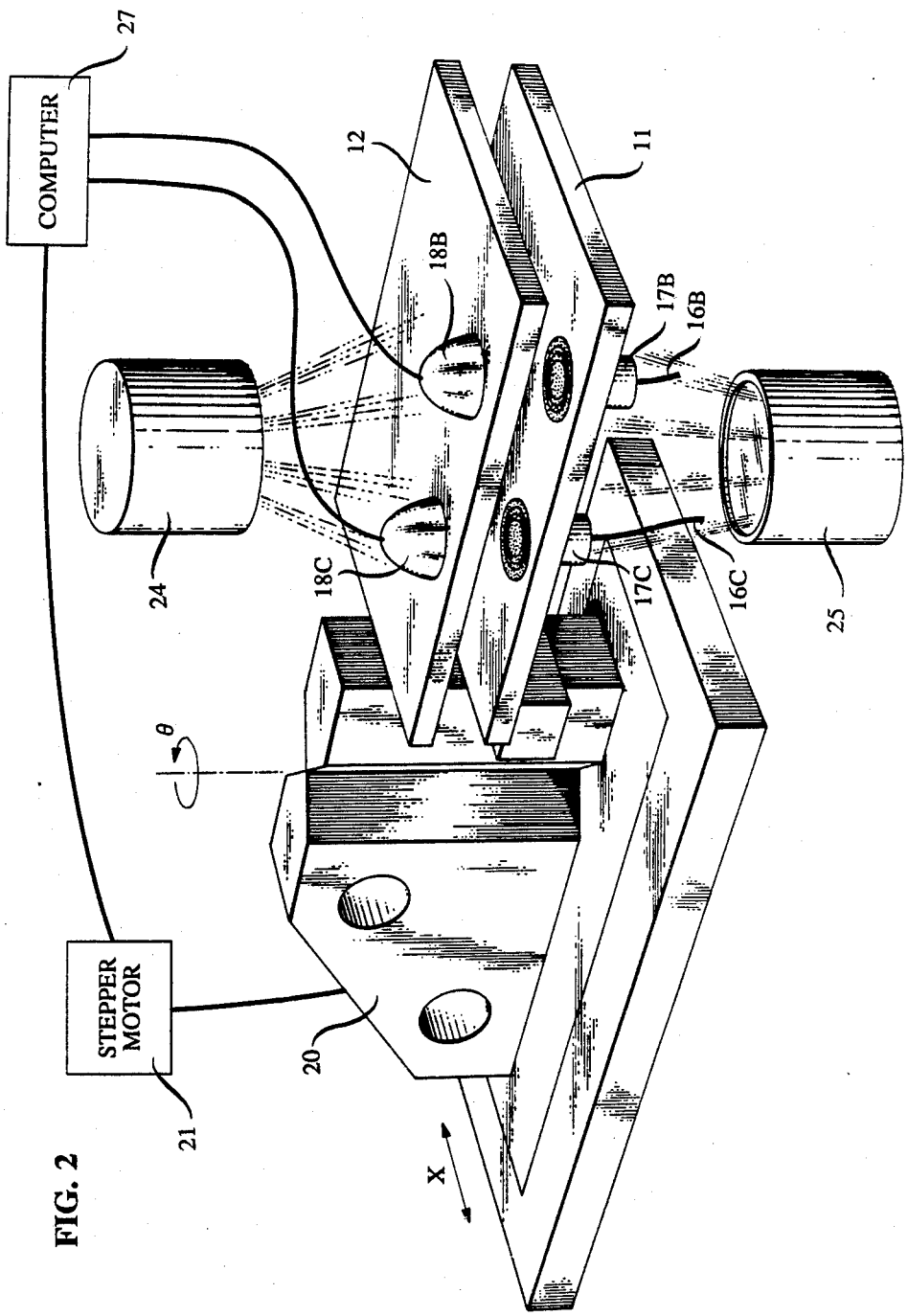
FIG. 2 is a schematic illustration of mask alignment and exposure apparatus in accordance with another embodiment of the invention.

FIG. 2 shows schematically a photomask alignment system in accordance with the invention that has been successfully used in the fabrication of optic fiber connectors. Elements having the same reference numbers as those of FIG. 1 perform the same functions and, for expediency, will not be further explained; however, it is the lower photomask that is actually moved into alignment, rather than the upper photomask as in FIG. 1.

A photomask holder 20 supports photomask 11 and is driven by a stepper motor 21 in X and $\theta$ directions as shown. Lenses 17B and 17C and optic fiber light sources 16B and 16C are fixed by an encapsulation to photomask 11 and are driven with it. Photomasks 11 and 12 are arranged on opposite sides of a silicon wafer (not shown) to be processed. The wafer is coated with a photoresist on top and bottom surfaces and both photomasks contain patterns to be transferred to the silicon wafer. After alignment, ultraviolet sources 24 and 25 expose the photoresist through the photomasks to define patterns that are subsequently used to control etching of the silicon wafer. After masking and detaching, the wafer is cut into chips that are thereafter used as optic fiber connectors.

The construction of holder 20 and the particular etching requirements for the wafer are such that the highly critical alignment capabilities of the invention are not required for alignment in the Y direction. Specifically, the apparatus is intended for the fabrication of optical fiber connections which require grooves on opposite sides of a chip that are extremely accurately aligned in the X and $\theta$ directions for accurate intermeshing with the other elements. Notice that for $\theta$ alignment, the holder 20 is rotated about an axis that is removed from photomasks 11 and 12.

Figure 3:
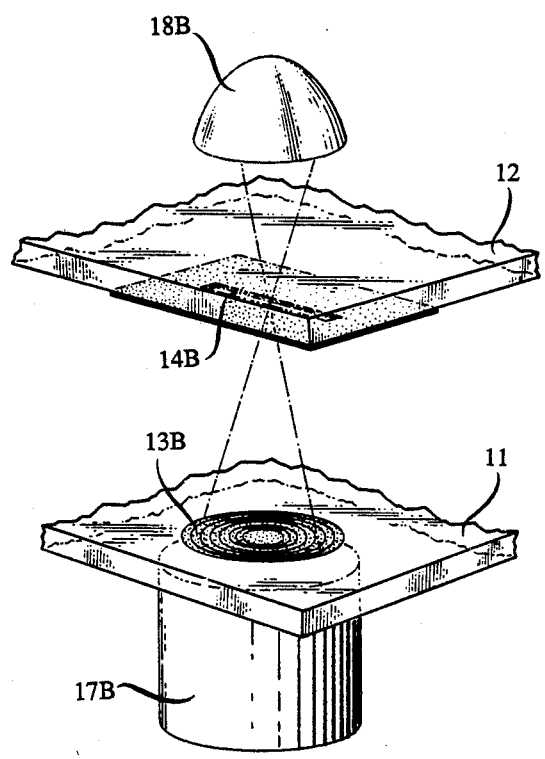
FIG. 3 is an expanded view of a portion of the apparatus of FIG. 2.

The photomasks, portions of which are shown in greater detail in FIG. 3, are essentially glass plates. The mask pattern and the transparent slits are formed on the lower surface of photomask 12, while the zone plates and lower photomask pattern are formed on the upper surface of photomask 11. Slit 14B and zone plate 13B are shown in FIG. 3. The transparent slits and the zone plates can conveniently be made by photolithographic masking and etching simultaneously with the formation of the mask patterns on photomasks 11 and 12 and by the same process.

The light sources 16B and 16C are optic fibers for transmitting light from a remote source and lenses 17B and 17C are glass lenses for collimating light from the optic fibers. The outputs of light detectors 18B and 18C are directed to a computer 27 which controls the stepper motor 21. The computer is programmed, using known techniques, to align the masks automatically in accordance with the invention.

Figure 4:
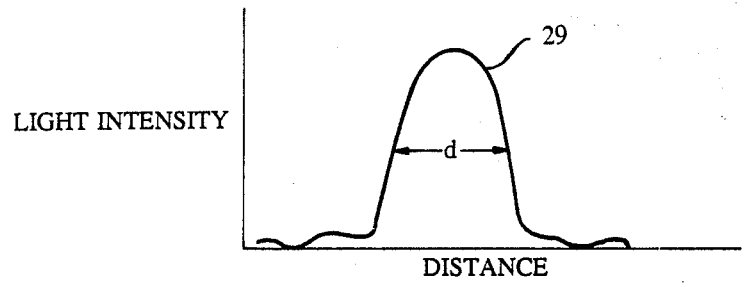
FIG. 4 is a graph of light intensity vs. distance generated by the light beam shown in FIG. 3.
Figure 5:
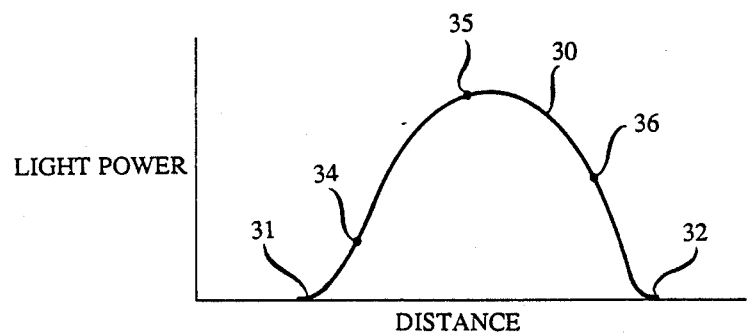
FIG. 5 is a graph of light power vs. distance as generated by the apparatus of FIGS. 2 and 3.

While the computer could be programmed to detect maximum light intensity through the slit, as has been described above, a more sophisticated method has been found for more accurately centering the slit on the focused beam. The light beam focused on the slit, or on the upper photomask 12 prior to alignment, has an intensity distribution as shown by curve 29 of FIG. 4. Curve 29, the light distribution resulting from one plate focusing, is known in the art as an Airy function. The spot size is taken as the distance d between curve segments at one-half the maximum intensity. As the spot illustrated in FIG. 4 is scanned across the rectangular slit, the resultant light power, or integrated light intensity, detected by the photodetector varies with distane, as shown by curve 30 of FIG. 5. Curve 30 is known mathematically as a convolution of the curve 29 of FIG. 4 and of the rectangular slit. Point 31 represents the distance along the scan at which light begins to enter the slit and point 32 is the point at which the light beam leaves the slit. Since the spot has a finite width, the distance between 31 and 32 is somewhat greater than the actual width of the slit.

Detection of the precise maximum, as mentioned before, may be somewhat difficult because the rate of change of slope of the curve at its maximum is relatively small. Instead, after the slit has initially been detected, a slow steeped scan is made such that three equally spaced samples of light output are taken as the beam traverses the split. The computer fits these samples to a parabolic function to determine the location of the central peak. The initiation of a subsequent scan is adjusted to make the function more centered, and the operation is iterated until centering is achieved.

With three samples, centering occurs when the two outer samples are equal. For example, assume that the set of samples taken during the first slow scan were points 34, 35 and 36. Since the value of point 34 is lower than point 36, the successive scan must be initiated at a location displaced slightly to the right. This will move point 34 "up the curve" and point 36 "down the curve." When the light power at points 34 and 36 is equal, then point 35 can be taken as being at the center of the slit and precise alignment is obtained. Such alignment is automatic and is made to tolerances of less than one micron.

During the rapid first scan for making the initial light detection, the scan steps were each 2.5 microns. The list width was 0.5 microns. During the slow scan, each step was 1.5 microns, which was appropriate for giving three readings within the slit width. The one-half maximum spot size was 2.5 microns; however, the detectable spot size width was significantly larger.

The angular or $\theta$ alignment is done in conjunction with the X-direction alignment. The extent to which light is not detected simultaneously by the two detectors, and the order in which light is detected, indicates the magnitude and direction of angular misalignment. The computer is programmed to make a $\theta$ adjustment during both the fast scans and the slow scans. After each show scan, both the initial location of the successive scan and the angular location of the mask are adjusted and scanning is repeated until accurate centering of both beams on both slits is simultaneously obtained. After alignment, the masks are fixed on opposite sides of the wafer and exposures of both sides of the wafer by sources 24 and 25 are made.

The specific embodiments described are intended to be merely illustrative of the invention. Other radiative forms may be the functional equivalents of light beams. Relative movement of the beam with respect to the transparent slit implies that either the beam or the slit may be stationary. Various other modifications and embodiments may be made by those skilled in the art without departing from the spirit and scope of the invention.

What is claimed is:

1. A method for fabricating devices from a flat member, comprising the steps of coating the member with photoresist material, aligning planar first and second masks on opposite sides of the member, exposing the masked photosensitive material to actinic light, developing the photosensitive material and using the developed photosensitive coating as a mask for selectively processing the flat member, characterized by the steps of:

forming at least a first zone plate in the first mask;

forming at least a first transplant slit in the second mask at a predetermined location with respect to the location in the first mask of the first zone plate; and wherein the alignment step comprises the step of directing a light beam through the first zone plate toward the second mask and moving the second mask relative to the first mask until the light beam is transmitted through the first transparent slit.

2. The method of claim 1 further characterized by the steps of:

forming a second zone plate in the first mask;

forming a second transparent slit in the second mask; and wherein the alignment step further comprises the steps of directing a light beam through the second zone plate toward the second mask and moving the second mask relative to the first mask until the second light beam is transmitted through the second transparent slit.

3. The method of claim 1 further characterized in that:

after the light beam is first transmitted through the first transparent slit, the second mask is moved relative to the first mask such as to cause the light beam to scan the width of the first transparent slit; during such scan a plurality of measurements of light intensity through the slit is made;

the measurements are fitted to a parabola; and thereafter the parabola is used to locate the second mask such that the center of the first transparent slit substantially coincides with the center of the light beam.

4. The method of claim 3 further characterized in that:

the light beam is caused to scan the width of the first transparent slit repetitively;

during each scan, three measurements of light intensity through the slit are made;

after each scan, the location of the initiation of successive scan is changed until two of the three measurements are substantially equal and the three measurements of light intensity vs. distance substantially describe a parabola; and such parabola is used to center the first transparent slit on the light beam.

5. The method of claim 1 further characterized in that:

the step of moving the second mask relative to the first mask comprises the step of fixing the second mask with respect to a reference structure and moving the first mask relative to the reference structure, and wherein the light beam is fixed with respect to the first mask.

6. A method for fabricating devices from a flat member, comprising the steps of coating the member with photoresist material; aligning planar first and second masks on opposite sides of the member; exposing the masked photosensitive material to actinic light; developing the photosensitive material and using the developed photosensitive coating as a mask for selectively processing a flat member, forming a zone plate in the first mask for confining the light beam; forming a transparent slit in the second mask in alignment with the zone plate; and wherein the alignment step comprises the steps of directing light through the zone plate toward the second mask; the zone plate confining the beam; and causing relative movement of the first mask with respect to the second mask until the confined beam is transmitted through the transparent slit and is detected by a photodetector, the light beam being sufficiently confined and that substantially no light is transmitted through the transparent slit if the transparent slit is significantly out of alignment with the zone plate.

* * * * *

UNITED STATES PATENT AND TRADEMARK OFFICE
CERTIFICATE OF CORRECTION

PATENT NO. : 4,835,078
DATED : May 30, 1989
INVENTOR(S) : George T. Harvey and Laurence S. Watkins It is certified that error appears in the above—identified patent and that said Letters Patent is hereby corrected as shown below:

Column 5, Line 23, "transplant" should read --transparent--.

Column 6, Line 15, "scan" should read --scans--.

Column 6, Line 36, "," should read --;--.

Column 6, Line 45, "," should read --;--.

Column 6, Line 46, delete "and".

Signed and Sealed this

Twenty-fourth Day of July, 1990

Attest:

HARRY F. MANBECK, JR.

Attesting Officer

Commissioner of Patents and Trademarks